(12) United States Patent
Tsuji et al.

(10) Patent No.: US 7,642,611 B2
(45) Date of Patent: Jan. 5, 2010

(54) SENSOR DEVICE, SENSOR SYSTEM AND METHODS FOR MANUFACTURING THEM

(75) Inventors: Koji Tsuji, Osaka (JP); Yoshiharu Sanagawa, Osaka (JP); Masao Kirihara, Osaka (JP); Kazuo Gouda, Osaka (JP); Youichi Nishijima, Osaka (JP)

(73) Assignee: Panasonic Electric Works Co., Ltd., Osaka (JP)

( * ) Notice: Subject to any disclaimer, the term of this patent is extended or adjusted under 35 U.S.C. 154(b) by 202 days.

(21) Appl. No.: 10/598,847

(22) PCT Filed: Mar. 29, 2005

(86) PCT No.: PCT/JP2005/006581

§ 371 (c)(1),
(2), (4) Date: Dec. 13, 2006

(87) PCT Pub. No.: WO2005/104228

PCT Pub. Date: Nov. 3, 2005

(65) Prior Publication Data

US 2008/0156095 A1 Jul. 3, 2008

(30) Foreign Application Priority Data

Apr. 22, 2004 (JP) .............................. 2004-127134

(51) Int. Cl.
*H01L 27/14* (2006.01)
*H01L 29/82* (2006.01)
*H01L 29/84* (2006.01)

(52) U.S. Cl. ................... 257/414; 257/415; 257/417; 257/418; 257/419; 257/E23.001

(58) Field of Classification Search ......... 257/414–415, 257/417–419, E23.001
See application file for complete search history.

(56) References Cited

U.S. PATENT DOCUMENTS 4,625,561 A * 12/1986 Mikkor ..................... 73/724

(Continued)

FOREIGN PATENT DOCUMENTS

EP    1433742    6/2004

(Continued)

OTHER PUBLICATIONS

English Language Abstract of JP 2003-188296.

(Continued)

*Primary Examiner*—Ida M Soward
(74) *Attorney, Agent, or Firm*—Greenblum & Bernstein P.L.C.

(57) ABSTRACT

A sensor system includes a sensor device (10) and an integrated circuit (20) for driving the device (10). The device (10) includes a sensor body (1) of a silicon-based material, an upper sealing member (2) of a silicon-based material, and a lower sealing member (3) of a silicon-based material. The upper sealing member (2) and the lower sealing member (3) are joined together to cooperatively house the body (1) therewithin in an airtight manner. The device (10) and the circuit (20) are formed as a stacked body. The body (1) is electrically connected to a wiring pattern (12) of the circuit (20) through a conductive through-path (4) penetrating the upper sealing member (4) and a mounting electrode (5) provided on an outer surface of the upper sealing member (2). The device (10) is connected to an MID substrate (30) through the circuit (20).

14 Claims, 8 Drawing Sheets

U.S. PATENT DOCUMENTS

| | | | |
|---|---|---|---|
| 5,686,698 A * | 11/1997 | Mahadevan et al. | 174/522 |
| 5,703,296 A * | 12/1997 | Little et al. | 73/756 |
| 6,137,151 A * | 10/2000 | Street | 257/443 |
| 6,649,991 B1 * | 11/2003 | Chen et al. | 257/433 |
| 6,686,667 B2 * | 2/2004 | Chen et al. | 257/787 |
| 6,966,228 B2 * | 11/2005 | Binet et al. | 73/754 |
| 7,402,814 B2 * | 7/2008 | Vieux et al. | 250/370.11 |
| 7,518,234 B1 * | 4/2009 | Okojie | 257/710 |
| 2002/0179986 A1 | 12/2002 | Orcutt et al. | |
| 2003/0113982 A1 | 6/2003 | Yamaguchi et al. | |
| 2004/0089955 A1 * | 5/2004 | Zhou | 257/787 |
| 2004/0129086 A1 * | 7/2004 | Binet et al. | 73/754 |
| 2004/0180517 A1 * | 9/2004 | Quenzer et al. | 438/479 |
| 2005/0072672 A1 * | 4/2005 | Hoorn | 204/416 |
| 2005/0167795 A1 | 8/2005 | Higashi | |
| 2008/0164864 A1 * | 7/2008 | Bjorn | 324/96 |

FOREIGN PATENT DOCUMENTS

| | | |
|---|---|---|
| JP | 5-223842 | 9/1993 |
| JP | 8-032090 | 2/1996 |
| JP | 8-078601 | 3/1996 |
| JP | 2001-144117 | 5/2001 |
| JP | 2001-153881 | 6/2001 |
| JP | 2003-188296 | 7/2003 |
| JP | 2004-209585 | 7/2004 |

OTHER PUBLICATIONS

English Language Abstract of JP 5-223842.
English Language Abstract of JP 2001-144117.
English Language Abstract of JP 8-032090.
English Language Abstract of JP 8-078601.
English Language Abstract of JP 2004-209585.
English Language Abstract of JP 2001-153881.

* cited by examiner

SENSOR DEVICE, SENSOR SYSTEM AND METHODS FOR MANUFACTURING THEM

TECHNICAL FIELD

The present invention relates to a sensor device, a sensor system and methods for manufacturing the sensor device and system.

BACKGROUND ART

Figure 12:
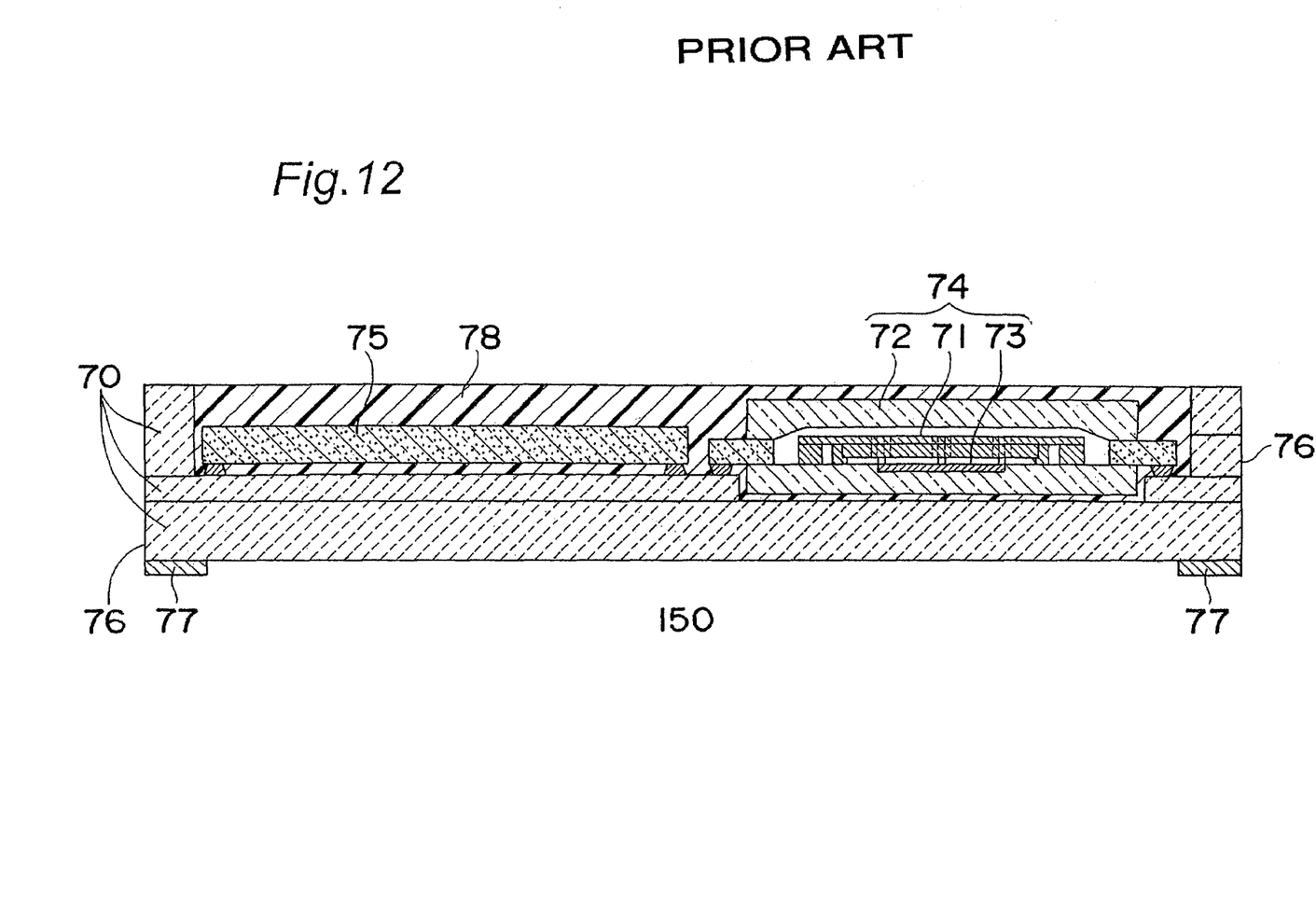
FIG. 12 is a vertical sectional view showing the structure of a conventional sensor system.

A microsystem integrally including a microsize sensor or actuator fabricated using micromachining techniques based on semiconductor processes and a drive circuit (including a control circuit) therefor is known and described as "MEMS" (Micro Electro Mechanical System). FIG. 12 is a sectional side view of a conventional sensor system formed as a MEMS. This sensor system 150 includes a ceramic substrate 70, a sensor device 74, an integrated circuit 75, a mounting external electrode 77, and a sealing material 78. The ceramic substrate 70 has a wiring pattern 76.

The sensor device 74 is designed to serve as an angular velocity sensor which includes a sensor body 71 made of a silicon-based material, an upper sealing member 72 made of glass, and a lower sealing member 73 made of glass. The upper and lower sealing members 72, 73 are provided as a means to house the sensor body 71 in an airtight manner. The integrated circuit 75 is designed to serve as a drive circuit for driving (and controlling) the sensor device 74, and formed as a bare chip connected through a bump to the wiring pattern 76 formed on the ceramic substrate 70. That is, the integrated circuit 75 is flip-chip-mounted on the ceramic substrate 70. The sensor device 74 is also mounted on the ceramic substrate 70 in the same manner as the flip-chip mounting. The sensor device 74 and the integrated circuit 75 are sealed by the resin sealing material 78. The sensor system 150 can be mounted on an external circuit board or the like through the mounting external electrode 77 connected to the wiring pattern 76. In this way, the sensor system 150 can be handled almost like a single integrated circuit.

As to the sensor device 74, a technique for sealing the silicon-based sensor body 71 with the glass upper and lower sealing members 72, 73 is commonly used in this field as disclosed, for example, in Japanese Patent Laid-Open Publication No. 2001-153881. However; this technique involves a problem about distortion or strain in the sensor body 71 to be caused by temperature changes due to the large difference in thermal expansion coefficient between silicon and glass. For example, this strain leads to change in resonance frequency of the sensor body 71 to cause temperature drift in characteristics as a sensor. Moreover, the sensor system 150 has a limitation in downsizing because the sensor device 74 and the integrated circuit 75 are mounted in such a manner that they are horizontally aligned with one another.

DISCLOSURE OF INVENTION

In view of the above problems, it is therefore an object of the present invention to provide a sensor device and system having reduced temperature drift in sensor characteristics and to provide methods for manufacturing the sensor device and system. It is another object of the present invention to provide a sensor system capable of facilitating downsizing and to provide a method for manufacturing the sensor system.

In order to achieve the above objects, according to a first aspect of the present invention, there is provided a sensor device which includes a sensor body, an upper sealing member made of the same material as that of the sensor body, and a lower sealing member made of the same material as that of the sensor body and joined to the upper sealing member so as to house the sensor body therewithin in cooperation with the upper sealing member.

According to a second aspect of the present invention, in the sensor device set forth in the first aspect of the present invention, the material of the sensor body, the upper sealing member and the lower sealing member is semiconductor.

According to a third aspect of the present invention, in the sensor device set forth in the first or second aspect of the present invention, the upper sealing member and the lower sealing member house the sensor body in an airtight manner.

According to a fourth aspect of the present invention, the sensor device set forth in either one of the first to third aspects of the present invention further includes a mounting electrode disposed on an outer surface of at least one sealing member selected from the upper sealing member and the lower sealing member, and a conductive through-path penetrating through the at least one sealing member to electrically connect between the mounting electrode and the sensor body.

According to a fifth aspect of the present invention, the sensor device set forth in the fourth aspect of the present invention further includes an insulating film disposed between the at least one sealing member and the conductive through-path.

According to a sixth aspect of the present invention, the sensor device set forth in either one of the first to third aspects of the present invention further includes a mounting electrode disposed on an outer surface of at least one sealing member selected from the upper sealing member and the lower sealing member, and a first wiring pattern extending along a junction surface of the at least one sealing member relative to the opposed sealing member to electrically connect between the mounting electrode and the sensor body.

According to a seventh aspect of the present invention, in the sensor device set forth in either one of the first to sixth aspects of the present invention, either one or each of the upper sealing member and the lower sealing member is an integrated circuit board formed with a circuit for driving the sensor body.

According to an eighth aspect of the present invention, there is provided a sensor system which includes the sensor device set forth in either one of the first to sixth aspects of the present invention, and an integrated circuit for driving the sensor device.

According to a ninth aspect of the present invention, the sensor system set forth in the eighth aspect of the present invention further includes an MID substrate interposed between the sensor device and the integrated circuit to support each of the sensor device and the integrated circuit in a stacked manner and adapted to relay the electrical connection between the sensor device and the integrated circuit, and a mounting external electrode provided in the MID substrate and electrically connected to at least either one of the sensor device and the integrated circuit through the MID substrate.

According to a tenth aspect of the present invention, in the sensor system set forth in the eighth aspect of the present invention, the integrated circuit and the sensor device are joined together to form a stacked body. This sensor system further includes an MID substrate supporting the stacked body without interposing between the sensor device and the integrated circuit, and a mounting external electrode provided in the MID substrate and electrically connected to at least either one of the sensor device and the integrated circuit through the MID substrate.

According to an eleventh aspect of the present invention, in the sensor system set forth in the ninth or tenth aspect of the present invention, the mounting external electrode is a stepwise bent pin.

According to a twelfth aspect of the present invention, in the sensor system set forth in the eight aspect of the present invention, the integrated circuit and the sensor device are joined together to form a stacked body. This sensor system further includes a mounting external electrode provided in the stacked body.

According to a thirteenth aspect of the present invention, in the sensor system set forth in the twelfth aspect of the present invention, the mounting external electrode is disposed on one surface of the integrated circuit on the opposite side of the other surface thereof facing to the sensor device, and the integrated circuit includes an integrated circuit board formed with a circuit for driving the sensor device, and a second wiring pattern extending along a side surface of the integrated circuit board to electrically connect between the mounting external electrode and the sensor device.

According to a fourteenth aspect of the present invention, in the sensor system set forth in the twelfth aspect of the present invention, the mounting external electrode is disposed on one surface of the sensor device on the opposite side of the other surface thereof facing to the integrated circuit, and the sensor device includes a second wiring pattern extending along respective side surfaces of the upper and lower sealing members to electrically connect between the mounting external electrode and the integrated circuit.

According to a fifteenth aspect of the present invention, there is provides a method of manufacturing the sensor device set forth in the fourth or fifth aspect of the present invention, which includes a first step of forming a through-hole in the at least one sealing member, and a second step of embedding a conductive material in the through-hole to form the conductive through-path.

According to a sixteenth aspect of the present invention, in the method set forth in the fifteenth aspect of the present invention, the second step includes a third step of depositing the conductive material on a surface of the through-hole, and a fourth step of, after the third step, depositing the conductive material to allow the through-hole to be entirely filled therewith.

According to a seventeenth aspect of the present invention, there is provided a method of manufacturing the sensor device set forth in the sixth aspect of the present invention, which includes a first step of forming a plating base layer on a surface of the at least one sealing member, a second step of selectively removing the plating base layer to pattern the plating base layer, a third step of plating a conductive material on the patterned plating base layer to form the first wiring pattern, a fourth step of forming the mounting electrode on the first wiring pattern, and a fifth step of, after the third step at the earliest, joining the upper and lower sealing members together to house the sensor body therewithin.

According to an eighteenth aspect of the present invention, there is provided a method of manufacturing the sensor system set forth in either one of the ninth to eleventh aspects of the present invention, which includes forming a portion electrically connecting between the MID substrate and either one of the sensor device and the integrated circuit, at normal temperature.

In the sensor device and the sensor system of the present invention, the upper and lower sealing members housing the sensor body are made of the same material as that of the sensor body. Thus, there is no difference in thermal expansion coefficient between these components. This makes it possible to suppress temperature drift due to the difference in thermal expansion coefficient between the components of the sensor device. In one preferred embodiment of the sensor system, the sensor device and the integrated circuit are arranged in a stacked manner so that downsizing in the sensor system can be facilitated. In addition, the sensor-device manufacturing method of the present invention makes it possible to readily manufacture a sensor device having suppressed temperature drift. Further, the sensor-system manufacturing method of the present invention can reduce a thermal strain which is likely to remain in the sensor device after the manufacturing of the sensor system, to suppress deviation from design values of sensor characteristics.

BRIEF DESCRIPTION OF DRAWINGS

A better understanding of the present invention can be obtained when the following detailed description of the preferred embodiment is considered in conjunction with the accompanying drawings. In the accompanying drawings, a common component or element is defined by the same reference numeral or code.

BEST MODE FOR CARRYING OUT THE INVENTION

This application is based upon and claims the benefit of priority from Japanese Patent Application No. 2004-127134 filed in Japan; the entire contents of which are incorporated herein by reference. Some embodiments of the present invention will now be specifically described.

FIRST EMBODIMENT

Figure 1A:
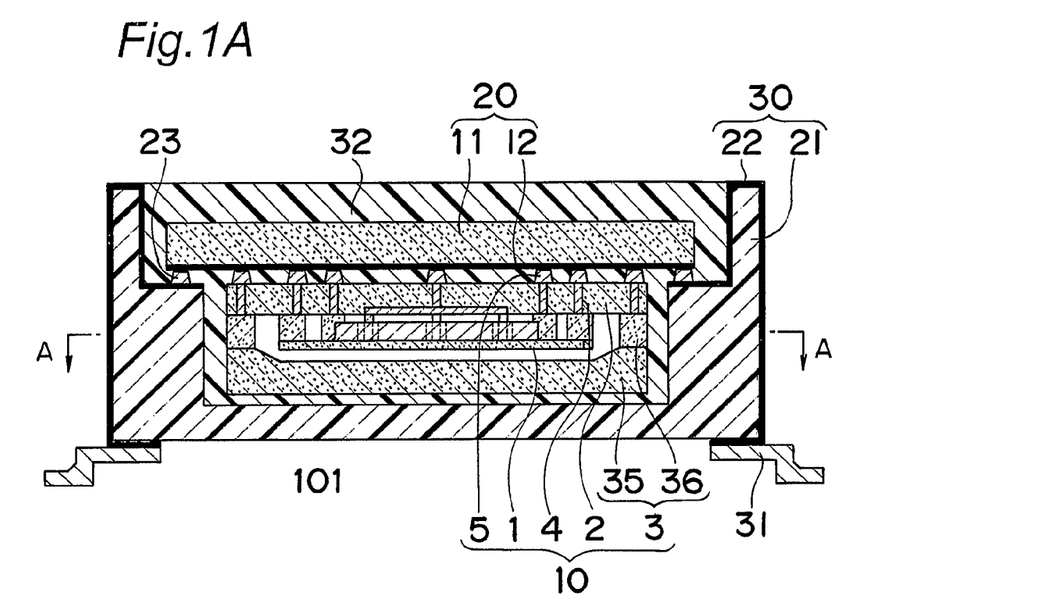
FIG. 1A is a vertical sectional view showing the structure of a sensor system according to a first embodiment of the present invention.
Figure 1B:
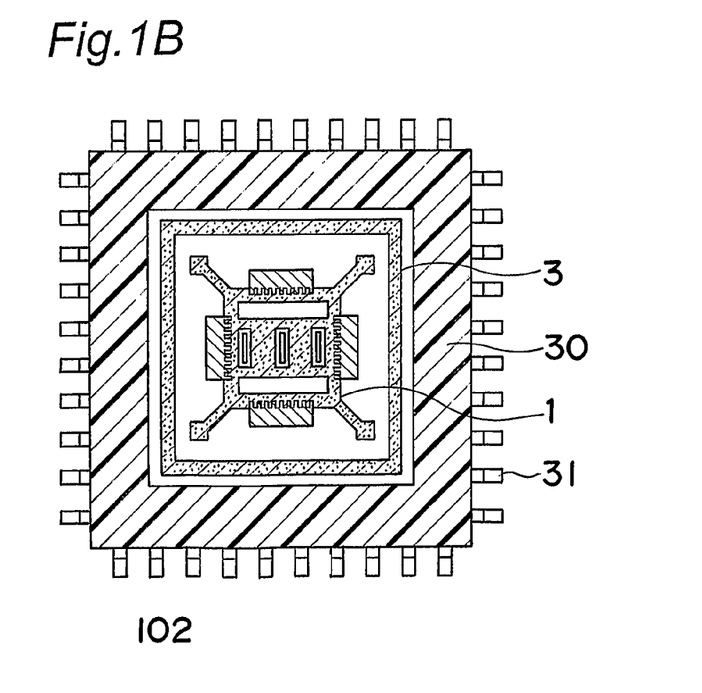
FIG. 1B is a sectional view taken along the line A-A in FIG. 1A.

FIG. 1 is a sectional view showing the structure of a sensor system according to a first embodiment of the present invention, wherein FIG. 1A is a vertical sectional view of the sensor system, and FIG. 1B is a sectional view taken along the line A-A in FIG. 1A. This sensor system 101 is formed as an MEMS which includes a sensor device 10, an integrated circuit 20, an MID (Molded Interconnect Device) substrate 30, a mounting external electrode 31, and a sealing material 32. The sensor device 10 is designed to serve, for example, as an angular velocity sensor. The sensor device 10 includes a sensor body 1 made of a silicon-based material, an upper sealing member 2 made of a silicon-based material, and a lower sealing member 3 made of a silicon-based material. The term "silicon-based material" herein means that the material may include not only pure silicon but also impurity-doped silicon.

The upper sealing member 2 and the lower sealing member 3 are joined together to form a cavity therewithin and house the sensor body 1 in the cavity in an airtight manner. The upper sealing member 2 and the lower sealing member 3 may be joined together by means of a conventional bonding technique for a silicon substrate. The upper sealing member 2 has an outer surface provided with a mounting electrode 5 for mounting the sensor device 10. The mounting electrode 5 is, for example, a bump electrode, and electrically connected to the sensor body 1 through a conductive through-path 4 made of a conductive material and formed to penetrate through the upper sealing member 2.

The lower sealing member 3 includes a plate-shaped sub-member 35 and a frame-shaped sub-member 36 joined to the plate-shaped sub-member 35. The sensor device 10 may be obtained as follows. The plate-shaped sub-member 35 is formed from one wafer, and the sensor body 1 and the frame-shaped sub-member 36 are formed from another wafer. Further, the upper sealing member 2 is formed from still another wafer. Each of the wafers is subjected to a process, for example, for forming the conductive through-path therein, and then the three wafers are joined together, for example, by a bonding process. Then, the joined body is cut into individual chips. While the frame-shaped sub-member 36 is included in the lower sealing member 3 in FIGS. 1A and 1B and other figures, it may be included in the upper sealing member.

The integrated circuit 20 is designed to serve as a drive circuit for driving (and controlling) the sensor device 10, and formed as a bare chip which is connected to the sensor device 10 through the mounting electrode 5 to form a 2-layer stacked body. The integrated circuit 20 includes a chip body 11 which is an integrated circuit board, and a wiring pattern 12 formed on one of opposite principal surfaces thereof. The mounting electrode 5 is connected to the wiring pattern 12. The stacked body including the sensor device 10 and the integrated circuit 20 is inserted into a concave portion formed in the MID substrate 30, and supported by the MID substrate 30. Further, the stacked body is sealed with the sealing material 32, such as resin.

The MID substrate, (3-dimensional circuit-forming substrate) 30 includes a substrate body 21 formed by molding an insulating material, such as insulating resin, and a wiring pattern 22 formed on a surface of the substrate body 21. The wiring pattern 22 is connected with the mounting external electrode 31 for mounting the sensor system 101 onto an external circuit board. The wiring pattern 12 of the integrated circuit 20 is connected to the wiring pattern 22 through a mounting electrode 23 for mounting the integrated circuit 20. This allows the stacked body to be electrically connected to the mounting external electrode 31. For example, the mounting electrode 23 is a bump electrode. In this way, the sensor system 101 can be handled almost like a single integrated circuit.

As above, in the sensor system 101, the sensor body 1 is housed in and fixed by the upper and lower sealing members 2, 3 made of the same material as that thereof. Thus, there is no difference in thermal expansion coefficient between these components. This makes it possible to eliminate temperature drift in sensor characteristics due to the difference in thermal expansion coefficient between the components of the sensor device 10. The integrated circuit 20 and the upper sealing member 2 interposed between the sensor body 1 and the MID substrate 30 allows temperature drift due to the difference in thermal expansion coefficient between the MID substrate 30 and the sensor device 10 to be kept at low level. This provides high-accuracy sensor characteristics.

In addition, the sensor body 1 and the mounting electrode 5 are connected to one another through the conductive through-path 4 penetrating through the upper sealing member 2, so that the sensor device 10 can be mounted in the same manner as a flip chip of an integrated circuit, and thereby downsized without the need for extending the lateral or horizontal length thereof. The upper sealing member 2 made of a silicon-based material can be subjected to a microfabrication process as well as the sensor body 1. This facilitates the formation of the conductive through-path 4. Further, the sensor device 10 and the integrated circuit 20 formed as a stacked body allow the sensor system 101 to be downsized. The integrated circuit 20 mounted on the MID substrate 30 in a flip-chip mounting manner also contributes to downsizing of the sensor system 101.

Furthermore, the use of the MID substrate 30 can facilitate the formation of the mounting external electrode 31. As shown in FIGS. 1A and 1B, the mounting external electrode 31 is formed as a stepwise bent pin. This structure can reduce a thermal strain which is likely to occur inside the sensor system 101 due to the difference in thermal expansion coefficient between the sensor system 101 and a circuit board (e.g. mother board) onto which the sensor system 101 is mounted. Thus, the adverse affect of thermal strain on sensor characteristics can be further suppressed.

FIGS. 2A to 2D are manufacturing process diagrams showing a process for forming the conductive through-path 4 in the upper sealing member 2. In the process for forming the conductive through-path 4 in the upper sealing member 2 a through-hole 42 is firstly formed in the upper sealing member 2 by use, for example, of an inductively-coupled plasma (ICP), and then a silicon dioxide insulating film 41 is formed on a surface of the upper sealing member 2, for example, by a thermal oxidation process (see FIG. 2A). Then, a conductive material 43, such as copper, is deposited on the surface of the upper sealing member 2, for example, by a CVD (Chemical Vapor Deposition or Chemical Vapor-Phase Epitaxy) process (see FIG. 2B). The conductive material 43 may be any suitable metal other than copper, for example impurity-doped polycrystalline silicon. Then, a conductive material 44 is further deposited, for example, by a copper plating process, to allow the through-hole 42 to be entirely filled with the conductive material 44 (see FIG. 2C). A CVD process may be used in place of the copper plating process. Then, the conductive material 44 is selectively removed by a metal RIE (Reactive Ion Etching) process, for example, using a mask pattern, to form wiring patterns (each including a pad) 46, 47 (see FIG. 2D).

In this way, the conductive through-path 4 can be readily formed in the upper sealing member 2 by a combination of the conventional semiconductor processes. In addition, the conductive material 44 can be readily embedded in the through-hole 42 by the process in FIG. 2C. Thus, the inner space defined by the upper and lower sealing members 2, 3 to house the sensor body 1 can be kept in an airtight state, particularly in a high-vacuum state. This makes it possible to obtain the sensor device 10 with enhanced quality. Further, the insulating film 41 formed on the surface of the upper sealing member 2 can provide an adequate electrical insulation between the conductive through-path 4 and the upper sealing member 2 made of a silicon-based material. This makes it possible to achieve enhanced accuracy in the sensor device 10.

Figure 2A:
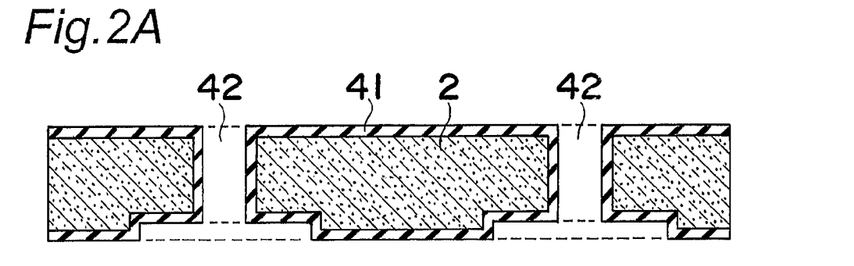
FIGS. 2A to 2D are manufacturing process diagrams showing a process for forming a conductive through-path in an upper sealing member in FIG. 1.
Figure 2B:
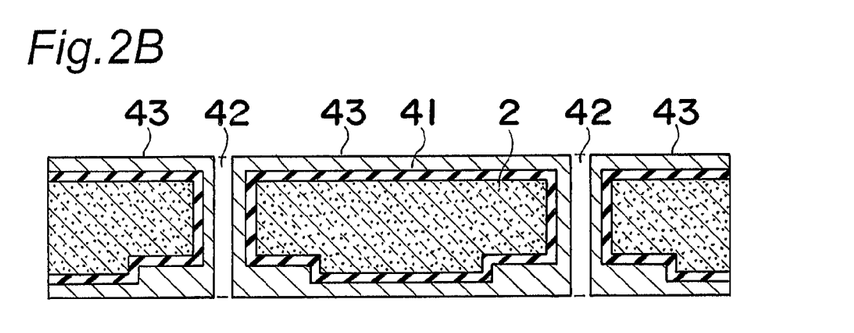
Figure 2C:
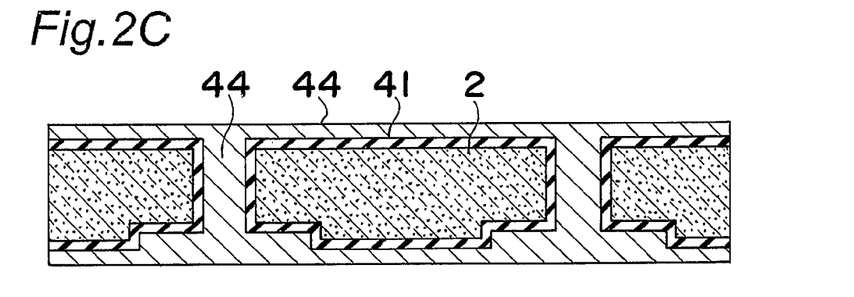
Figure 2D:
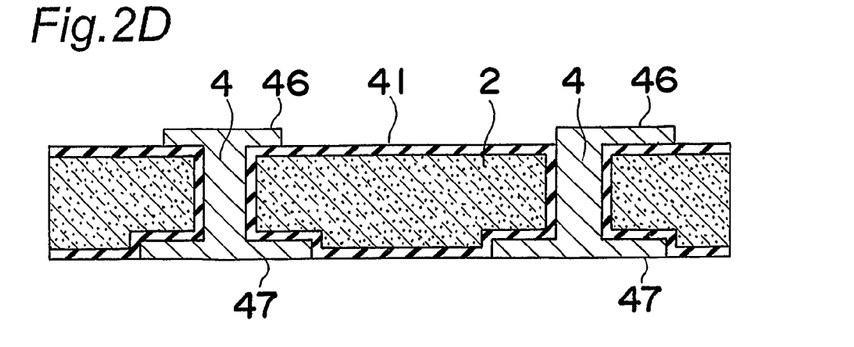

As shown in FIG. 2D, the upper sealing member 2 may be formed to have a flat bottom surface to facilitate the bonding relative to the lower sealing member 3. Instead of or in addition to the upper sealing member 2, the lower sealing member 3 may be formed with the conductive through-path 4.

Each of the sensor body 1, the upper sealing member 2 and the lower sealing member 3 may be made of any suitable semiconductor other than the silicon-based material. However, it is particularly desirable to use silicon-based material, because, among a number of semiconductors, microfabrication techniques for silicon have been widely established, and the material cost of silicon is relatively low. Further, even if each of the sensor body 1, the upper sealing member 2 and the lower sealing member 3 is not made of semiconductor, the problem about temperature drift due to the difference in thermal expansion coefficient can be eliminated as long as they are made of a common or identical material. However, the use of semiconductor makes it possible to facilitate the microfabrication through a conventional semiconductor process so as to readily achieve enhanced accuracy and downsizing in the sensor device 10 and the sensor system 101.

SECOND EMBODIMENT

Figure 3:
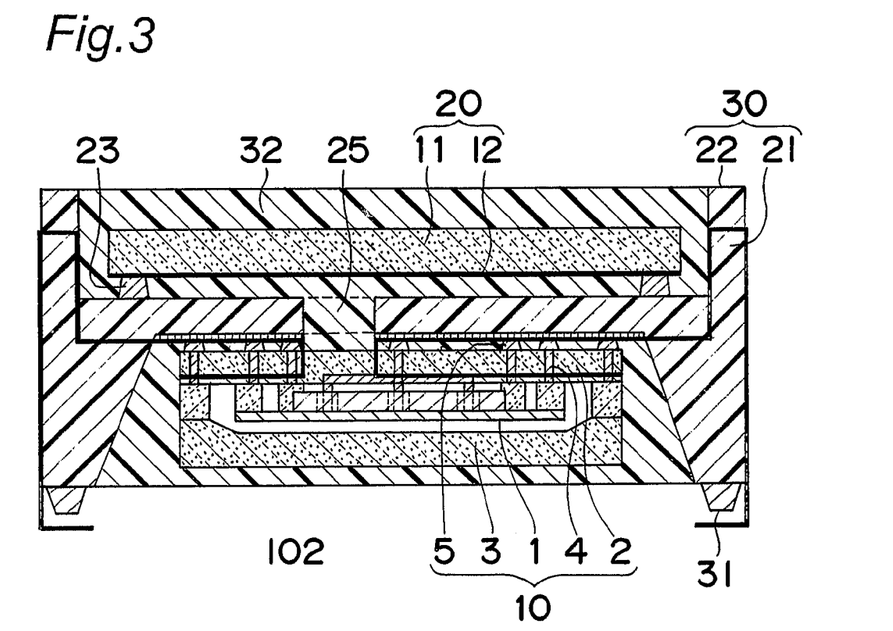
FIG. 3 is a vertical sectional view showing the structure of a sensor system according to a second embodiment of the present invention.

FIG. 3 is a vertical sectional view showing the structure of a sensor system according to a second embodiment of the present invention. In FIG. 3 and other figures, a component or element structurally or functionally identical to that in FIGS. 1A and 1B is defined by the same reference numeral or code, and its detailed description will be omitted. The sensor system 102 illustrated in FIG. 3 is mainly different from the sensor system 101 in FIGS. 1A and 1B, in that an MID substrate 30 is formed to interpose between a sensor device 10 and an integrated circuit 20 which are arranged in a stacked manner. The sensor device 10 is connected to a wiring pattern 22 through a mounting electrode 5, and the integrated circuit 20 is connected to the wiring pattern 22 through a mounting electrode 23. The MID substrate 30 is formed with an opening 25, and the wiring pattern 30 is also formed in the opening 25. Thus, the MID substrate 30 also relays the electrical connection between the sensor device 10 and the integrated circuit 20. Further, at least either one of the sensor device 10 and the integrated circuit 20 is connected to a mounting external electrode 31 through the wiring pattern 22. In the embodiment illustrated in FIG. 3, both of the sensor device 10 and the integrated circuit 20 are connected to the mounting external electrode 31.

As above, in the sensor system 102, a sensor body 1 is housed in and fixed by an upper sealing member 2 and a lower sealing member 3 which are made of the same material as that of the sensor body 1, as with the sensor system 101. This makes it possible to eliminate temperature drift in sensor characteristics due to the difference in thermal expansion coefficient between the components of the sensor device 10. In addition, the sensor device 10 and the integrated circuit 20 are arranged in a stacked manner through the MID substrate 30. Thus, the sensor system 102 can be downsized. The sensor device 10 and the integrated circuit 20 each mounted on the MID substrate 30 in a flip-chip mounting manner also contribute to downsizing of the sensor system 102. Further, the use of the MID substrate 30 can facilitate the formation of the mounting external electrode 31. Furthermore, differently from the sensor system 101, the mounting external electrode 31 is formed as a bump electrode. This makes it possible to further reduce a mounting area of the sensor system on a circuit board, such as a mother board.

In a manufacturing process for the sensor system 102, it is preferable that the junction between the sensor device 10 and the MID substrate 30 through the mounting electrode 5 and the junction between the integrated circuit 20 and the MID substrate 30 through the mounting electrode 23 are formed at normal temperature. For example, these junctions can be formed at normal temperature by activating a surface of the electrode using plasma and pressing the surface onto the associated component. The term "normal temperature" herein means any temperature falling within a rated operating temperature range (e.g. 0 (zero) ° C. to +80° C.) of the sensor system 102. This operation makes it possible to reduce or eliminate a thermal stress which is likely to remain in the finished sensor system 102, so as to suppress the deterioration in sensor quality of the sensor device 10.

THIRD EMBODIMENT

Figure 4:
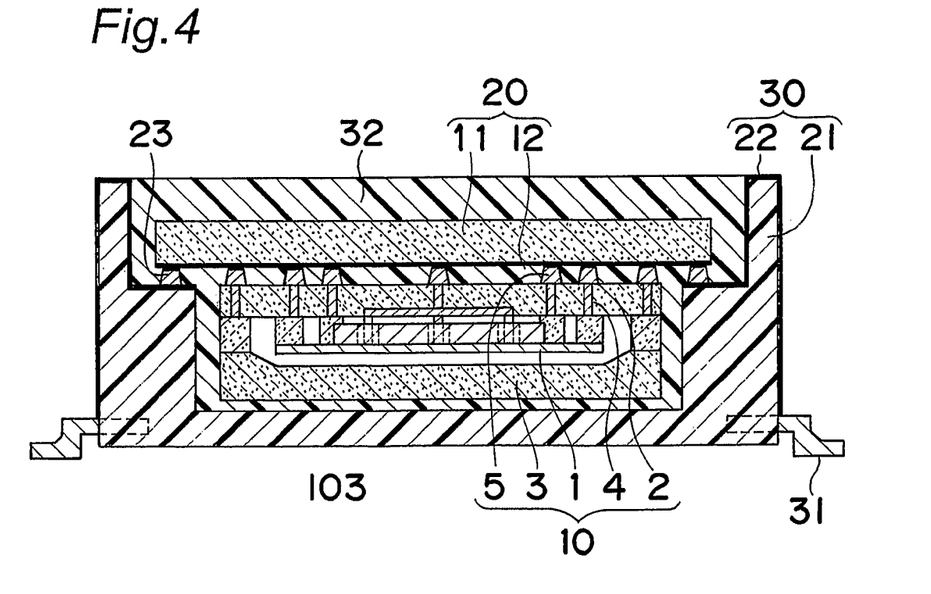
FIG. 4 is a vertical sectional view showing the structure of a sensor system according to a third embodiment of the present invention.

FIG. 4 is a vertical sectional view showing the structure of a sensor system according to a third embodiment of the present invention. This sensor system 103 is mainly different from the sensor system 101 illustrated in FIGS. 1A and 1B, in that an anchor end of a mounting external electrode 31 is embedded in a substrate body 21 of an MID substrate 30. As with the sensor system 101, the mounting external electrode 31 in the sensor system 103 is formed as a stepwise bent pin. This structure can reduce a thermal strain which is likely to occur inside the sensor system 103 due to the difference in thermal expansion coefficient between the sensor system 103 and a circuit board onto which the sensor system 103 is mounted. Thus, the deterioration in sensor characteristics due to the thermal strain can be suppressed.

The mounting external electrode 31 may be embedded in the substrate body 21 by preparing a lead frame (not shown) having a number of mounting external electrodes 31 connected to each other, and forming (molding) the substrate body 21 with resin or the like integrally with the lead frame. After completion of the formation of the substrate body 21, the mounting external electrodes 31 is cut off from the lead frame, and formed in a stepped shape. In this manner, the mounting external electrodes 31 having the shape in FIG. 4 can be readily obtained.

FOURTH EMBODIMENT

Figure 5:
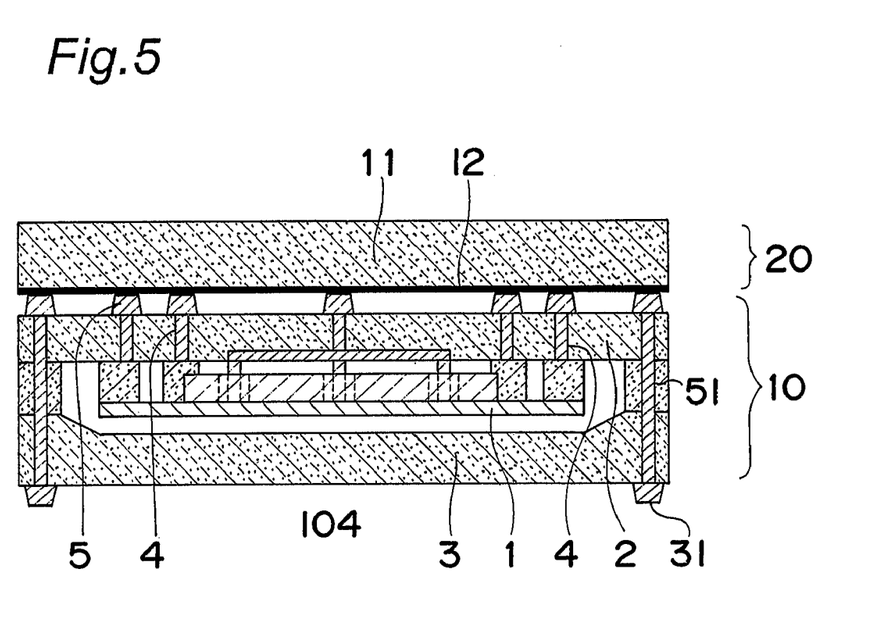
FIG. 5 is a vertical sectional view showing the structure of a sensor system according to a fourth embodiment of the present invention.

FIG. 5 is a vertical sectional view showing the structure of a sensor system according to a fourth embodiment of the present invention. In this sensor system 104, a sensor device 10 and an integrated circuit 20 are joined together without interposing an MID substrate 30, to form a stacked body, as with the sensor system 101 illustrated in FIGS. 1A and 1B.

However, the sensor system 104 is mainly different from the sensor system 101 illustrated in FIGS. 1A and 1B, in that a mounting external electrode 31 provided to the sensor device 10. That is, the sensor system 104 requires no MID substrate 30. In the embodiment illustrated in FIG. 5, the mounting external electrode 31 is connected to a wiring pattern 12 of the integrated circuit 20 through a mounting electrode 5 and respective conductive through-paths 51 which penetrate through an upper sealing member 2 and a lower sealing member 3. In a manufacturing process of the sensor system 104, the conductive through-paths 51 are readily connected together by a pressing force to be applied during bonding between the upper and lower sealing members 2, 3. As above, the sensor system 104 requiring no MID substrate 30 can be further downsized, and a mounting area relative to a circuit board can be further reduced. In addition, the sensor system 104 requiring no MID substrate 30 can avoid the problem about a thermal stress due to the difference in thermal expansion coefficient between the MID substrate 30 and the sensor device 10. This makes it possible to further suppress the deviation from design values of sensor characteristics and the temperature drift in sensor characteristics during use so as to provide further enhanced quality in sensor characteristics.

FIFTH EMBODIMENT

Figure 6:
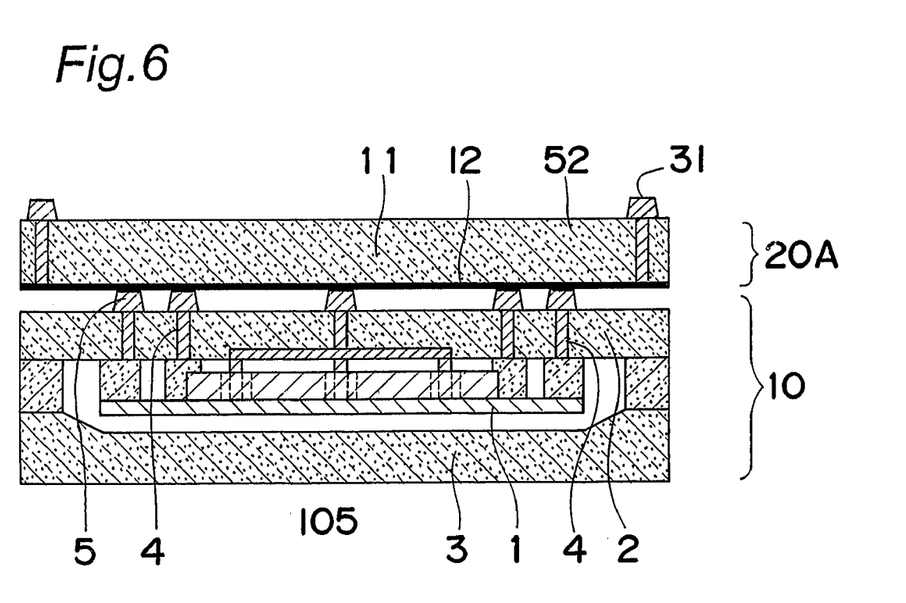
FIG. 6 is a vertical sectional view showing the structure of a sensor system according to a fifth embodiment of the present invention.

As in a sensor system 105 illustrated in FIG. 6, the mounting external electrode 31 in the sensor system 104 may be provided to an integrated circuit 20A. In a fifth embodiment illustrated in FIG. 6, the external electrode 31 is connected to a wiring pattern 12 through a conductive through-path 52 penetrating through the integrated circuit 20A. In this embodiment, the same advantages as those described in connection with the sensor system 104 can be obtained.

SIXTH EMBODIMENT

Figure 7:
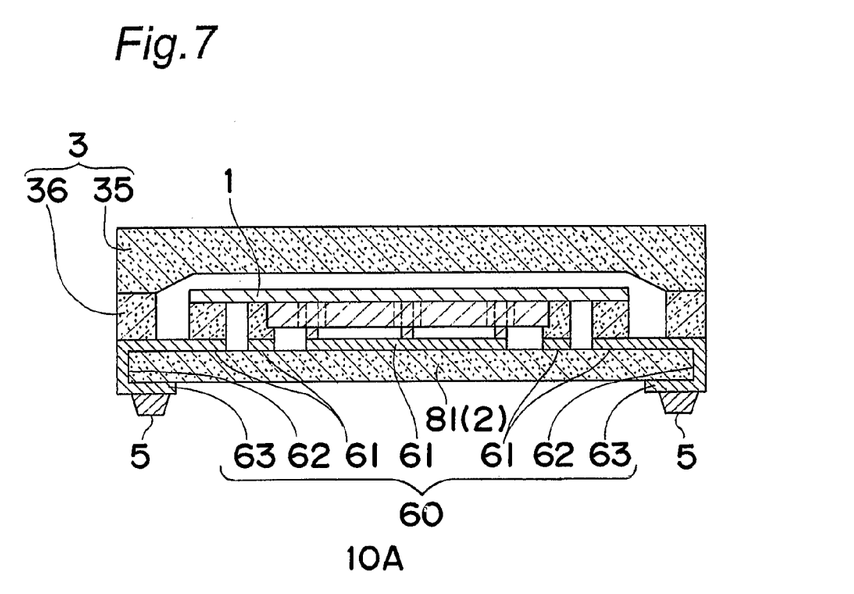
FIG. 7 is a vertical sectional view showing the structure of a sensor device according to a sixth embodiment of the present invention.

FIG. 7 is a vertical sectional view showing the structure of a sensor device according to a sixth embodiment of the present invention. This sensor device 10A is different from the sensor device 10 illustrated in FIGS. 1 to 6, in that an upper sealing member 2 is formed as an integrated circuit board or a chip body 81, and a sensor body 1 and a mounting electrode 5 are electrically connected to one another through a wiring pattern 60 formed to extend along a junction surface of the chip body 81, in place of the conductive through-path 4. The chip body 81 is formed with a circuit (not shown) for driving the sensor body 1. A combination of the chip body 81 and the wiring pattern 60 serves as an integrated circuit.

The wiring pattern 60 includes a wiring pattern 61 formed on an inner principal surface of the chip body 81, a wiring pattern 62 formed on a side surface of the chip body 81, and a wiring pattern 63 formed on an outer principal surface of the chip body 81. The wiring patterns 61, 62, 63 are connected to each other. The sensor body 1 is electrically connected to the wiring pattern 61. The mounting electrode 5 is formed on the wiring pattern 63. The wiring pattern 61 is also formed on a junction surface of the chip body 81 relative to an opposed lower sealing member 3 to achieve the electrical connection between the sensor body 1 and the mounting electrode 5, without using the conductive through-path 4.

In the sensor device 10A, at least a part of the chip body 81 or the upper sealing member 2 is joined to the lower sealing member 3 while interposing the wiring pattern 61 therebetween. In this specification, this state is also described such that the lower sealing member 3 and the upper sealing member (chip body 81) are joined together.

FIGS. 8A to 8H are manufacturing process diagrams showing a process for forming the wring pattern 60 on the chip body 81. FIGS. 8A, 8C, 8E and 8G are vertical sectional views of the chip body 81 in respective operations, and FIGS. 8B, 8D, 8F and 8H are side views of the chip body 81 in respective operations, wherein each of FIGS. 8A, 8C, 8E and 8G is a vertical sectional views taken along the line B-B in a corresponding one of FIGS. 8B, 8D, 8F and 8H.

Figure 8A:
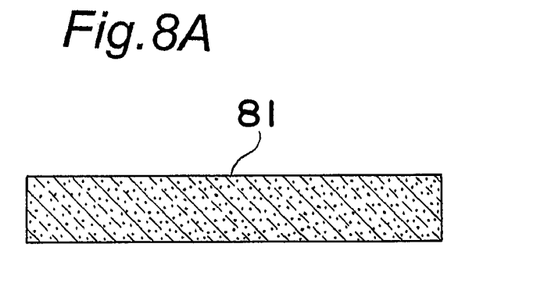
FIGS. 8A to 8H are manufacturing process diagrams showing a process for forming a wring pattern on a chip body in FIG. 7.
Figure 8B:
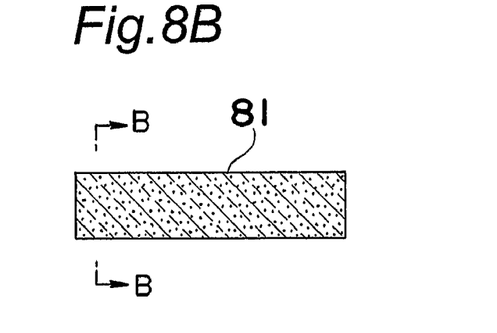
Figure 8C:
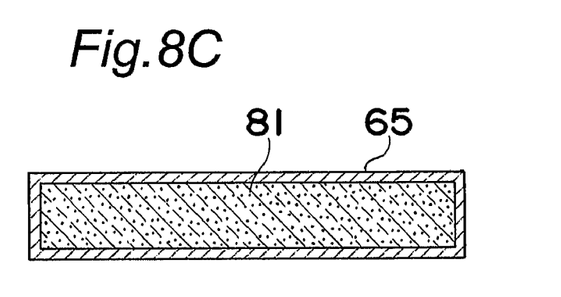
Figure 8D:
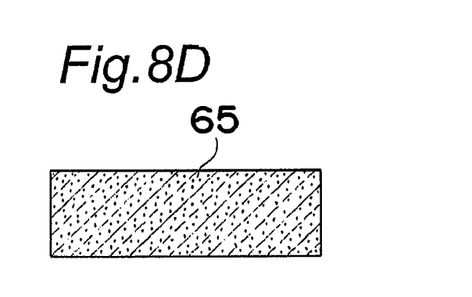

In the process for forming the wiring pattern 60, the chip body 81 having a circuit formed through a conventional semiconductor process is firstly prepared (see FIGS. 8A and 8B). While the chip body 81 is preferably a wafer before cleaving in view of facilitation of the manufacturing process, it may be a wafer after cleaving. Then, a plating base layer 65 is formed on the entire surface of the chip body 81 (see FIGS. 8C and 8D). The plating base layer 65 is formed, for example, by an aluminum sputtering process. For example, the plating base layer 65 is formed to have a thickness of about 1 μm.

Figure 8E:
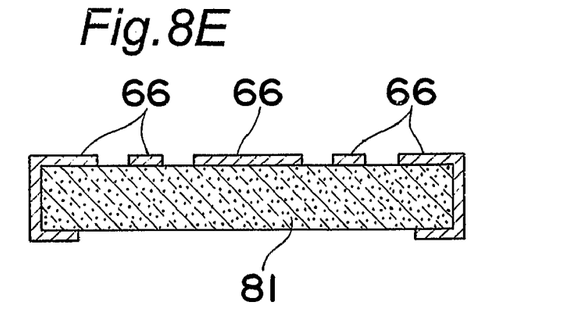
Figure 8F:
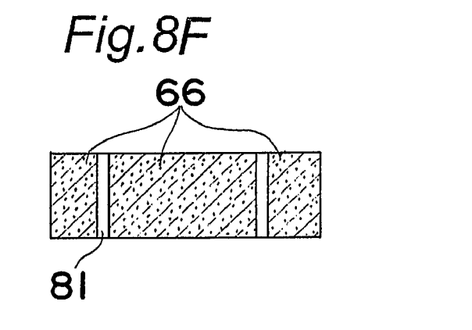
Figure 8G:
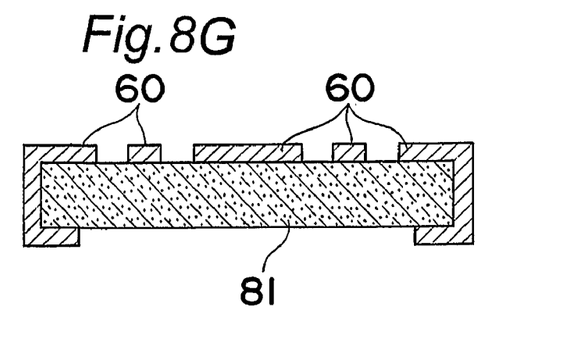

Then, the plating base layer 65 is selectively removed to pattern the plating base layer 65 (see FIGS. 8E and 8F). For example, the selective removal of the plating base layer 65 may be achieved by selectively irradiating the plating base layer 65 with a laser beam. Alternatively, the plating base layer 65 may be selectively removed by means of lithography. Then, the wiring pattern 60 is formed on the patterned plating base layer 66 by a plating process, for example, including immersing a product obtained by the operation in FIGS. 8E and 8F in a plating bath, and supplying a certain current thereto (see FIGS. 8G and 8H). For example, the wiring pattern 60 is formed using nickel to have a thickness of about 10 μm.

Figure 8H:
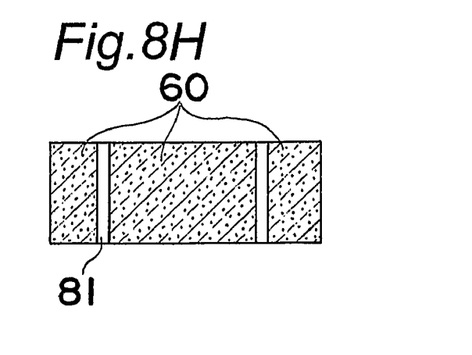

In FIG. 8H, if a central one of three divided regions of the wiring pattern 60 is unnecessary, the patterning may be performed such that this central region is isolated from the remaining regions. Thus, no current flows through the central region during the plating process, so that the formation of the wiring pattern 60 in the central region can be avoided. Alternatively, the plating base layer 65 may be patterned such that no plating base layer 65 is left in the central region, so as to prevent the formation of the wiring pattern 60 in the central region. However, when the patterning is performed using a laser beam, it is desirable to minimize an area to be irradiated with the laser beam, so as to obtain higher throughput. Further, as long as the wiring pattern 60 formed in the central region does not hinder the operation of the circuit even if it is unnecessary, the wiring pattern 60 may be formed in the central region as shown in FIG. 8H.

Returning to FIG. 7, the mounting electrode 5 is then formed on the wiring pattern 63 as a portion of the wiring pattern 60. Then, the lower sealing member 3 and the chip body 81 or the upper sealing member 2 are joined together, for example, by a bonding process, to obtain the sensor device 10A as shown in FIG. 7.

As above, the sensor device 10A using the chip body 81 as the upper sealing member 2 can achieve a function equivalent to that of the sensor system 104 in FIG. 5 or other sensor system, without the need for additionally providing the integrated circuit 20 or 20A. Thus, the sensor device 10A can achieve downsizing in the sensor system. In addition, without using the conductive through-path 4, the sensor body 1 and the mounting electrode 5 can be electrically connected to each other through the wiring pattern 60 formed to extend along the junction surface. Thus, the space for forming the conductive through-path 4 is not required. This contributes to further downsizing in the sensor system. Further, the wiring pattern 60 capable of being formed in a more simplified manner as compared to the conductive through-path 4 makes it possible to achieve a reduced manufacturing cost.

Instead of the wiring pattern 60, a conductive through-path 4 may be formed in the chip body 81. In this case, the advantages obtained by using the chip body 81 as the upper sealing member 2 can be obtained. Further, a circuit may also be formed in the lower sealing member 3 as well as the upper sealing member 2 in the same manner as the chip body 81.

SEVENTH EMBODIMENT

Figure 9:
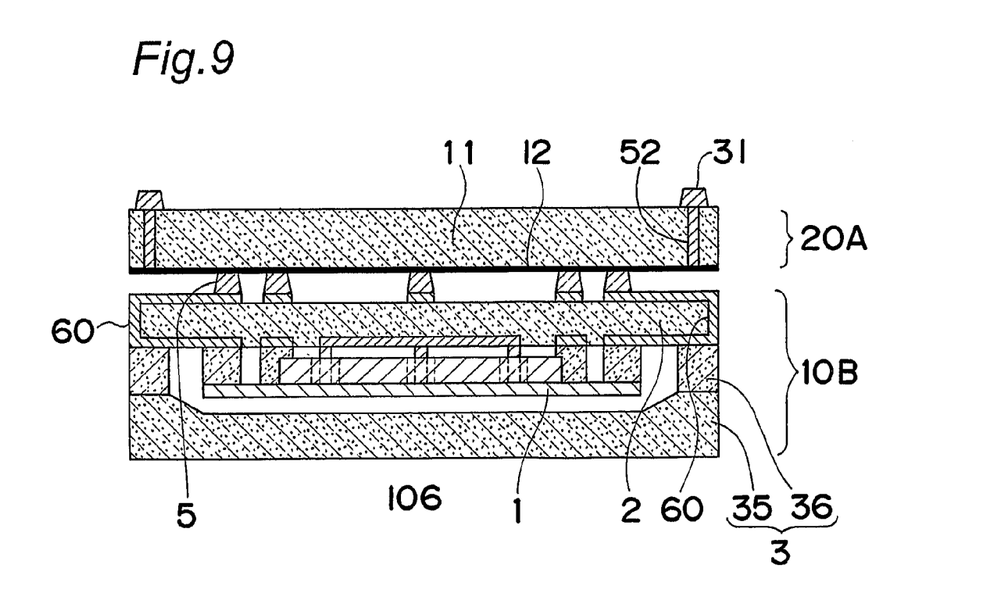
FIG. 9 is a vertical sectional view showing the structure of a sensor system according to a seventh embodiment of the present invention.

FIG. 9 is a vertical sectional view showing the structure of a sensor system according to a seventh embodiment of the present invention. This sensor system 106 is different from the sensor system 105 illustrated in FIG. 6, in that a sensor body 1 and a mounting electrode 5 are electrically connected to one another through a wiring pattern 60 formed to extend along a junction surface of an upper sealing member 2 relative to an opposed lower sealing member 3. Differently from the chip body 81 illustrated in FIG. 7, this upper sealing member 2 is formed with no circuit. That is, a sensor device 10B in the sensor system 106 is different from the sensor device 10A illustrated in FIG. 7, in that the upper sealing member 2 is not a chip body 81. The wiring pattern 60 may be formed on the upper sealing member 2 through the same process as that as shown in FIGS. 8A to 8H.

According to the sensor system 106, without using the conductive through-path 4, the sensor body 1 and the mounting electrode 5 can be electrically connected to each other through the wiring pattern 60 formed to extend along the junction surface. Thus, the space for forming the conductive through-path 4 is not required. This allows the sensor system 106 to be downsized. Further, the wiring pattern 60 capable of being formed in a more simplified manner as compared to the conductive through-path 4 makes it possible to achieve a reduced manufacturing cost.

EIGHTH EMBODIMENT

Figure 10:
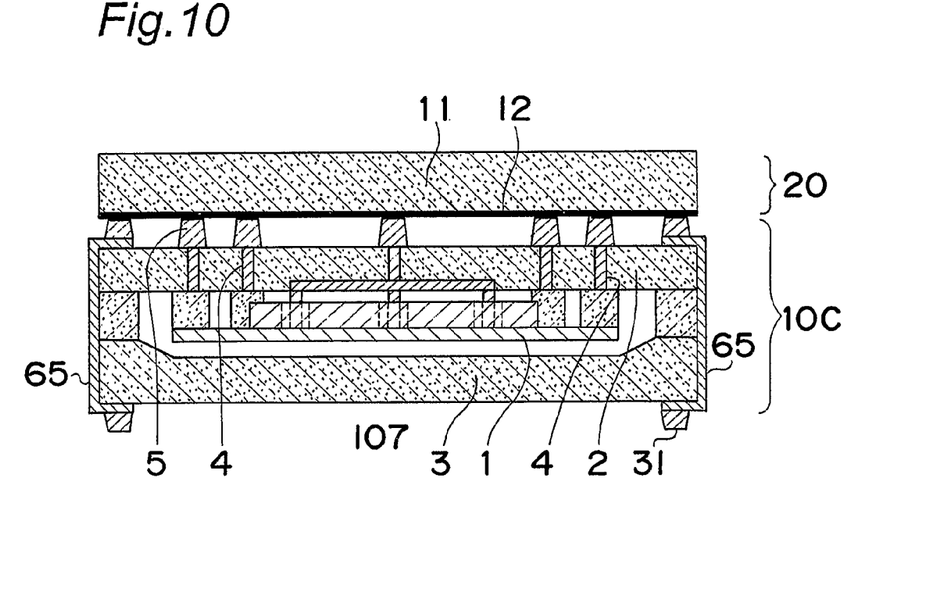
FIG. 10 is a vertical sectional view showing the structure of a sensor system according to an eighth embodiment of the present invention.

FIG. 10 is a vertical sectional view showing the structure of a sensor system according to an eighth embodiment of the present invention. This sensor system 107 is different from the sensor system 104 illustrated in FIG. 5, in that, instead of the conductive through-path 51 penetrating the upper and lower sealing members 2, 3 in the sensor system 104, the sensor system 107 is provided with a wiring pattern 65 extending along respective side surfaces of an upper sealing member 2 and a lower sealing member 3 to electrically connect between a mounting external electrode 31 and an integrated circuit 20. The wiring pattern 65 can be readily formed by performing the process as shown in FIGS. 8A to 8H on the assumption that the chip body 81 is substituted with a stacked body formed by joining the upper and lower sealing members 2, 3 together.

According to the sensor system 107, without using the conductive through-path 51, the mounting external electrode 31 and the integrated circuit 20 can be electrically connected to each other through the wiring pattern 65 formed to extend along the respective side surfaces of the upper and lower sealing members 2, 3. Thus, the space for forming the conductive through-path 51 is not required. This allows the sensor system 107 to be downsized. Further, the wiring pattern 65 capable of being formed in a more simplified manner as compared to the conductive through-path 51 makes it possible to achieve a reduced manufacturing cost.

NINTH EMBODIMENT

Figure 11:
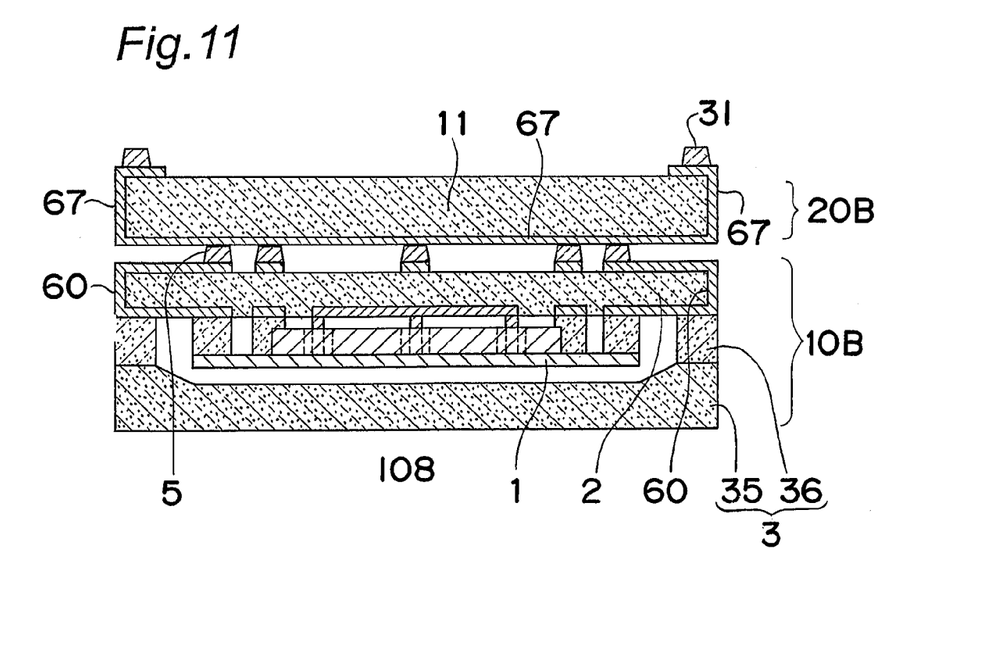
FIG. 11 is a vertical sectional view showing the structure of a sensor system according to a ninth embodiment of the present invention.

FIG. 11 is a vertical sectional view showing the structure of a sensor system according to a ninth embodiment of the present invention. This sensor system 109 is different from the sensor system 106 illustrated in FIG. 9, in that an integrated circuit 20B is provided with a wiring pattern 67 extending along a side surface of a chip body 11 to electrically connect between a mounting external electrode 31 and a sensor device 10B, and the conductive through-path 52 penetrating the chip body 11 in the sensor system 106 is eliminated. A portion of the wiring pattern 67 formed on a principal surface of the chip body 11 opposed to the sensor device 10B is the same as the wiring pattern 12 in FIG. 9. The wiring pattern 67 can be readily formed by performing the process as shown in FIGS. 8A to 8H on the assumption that the chip body 81 is substituted with the chip body 11.

According to the sensor system 108, without using the conductive through-path 52, the mounting external electrode 31 and the sensor device 10B can be electrically connected to each other through the wiring pattern 67 formed to extend along the side surface of the chip body 11. Thus, the space for forming the conductive through-path 52 is not required. This allows the sensor system 108 to be downsized. Further, the wiring pattern 67 capable of being formed in a more simplified manner as compared to the conductive through-path 52 makes it possible to achieve a reduced manufacturing cost.

While the present invention has been described in conjunction with specific embodiments thereof, various modifications and alterations will become apparent to those skilled in the art. Therefore, it is intended that the present invention is not limited to the illustrative embodiments herein, but only by the appended claims and their equivalents.

INDUSTRIAL APPLICABILITY

As mentioned above, the sensor device and the sensor system according to the present invention are useful, particularly, in detecting angular velocity or acceleration, and suitable for use in an angular velocity sensor or an acceleration sensor for a vehicle or the like.

The invention claimed is:
1. A sensor device comprising:
   a sensor body;
   an upper sealing member made of the same material as that of said sensor body;
   a lower sealing member made of the same material as that of said sensor body, said lower sealing member being joined to said upper sealing member so as to house said sensor body therewithin in cooperation with said upper sealing member;
   a mounting electrode disposed on an outer surface of at least one sealing member selected from said upper sealing member and said lower sealing member;
   a conductive through-path penetrating through said at least one sealing member to electrically connect between said mounting electrode and said sensor body, and
   an insulating film disposed between said at least one sealing member and said conductive through-path.
2. The sensor device according to claim 1, wherein the material of said sensor body, said upper sealing member and said lower sealing member is semiconductor.

3. The sensor device according to claim 1, wherein said upper sealing member and said lower sealing member house said sensor body in an airtight manner.

4. The sensor device according to claim 1, wherein either one or each of said upper sealing member and said lower sealing member is an integrated circuit board formed with a circuit for driving said sensor body.

5. A method of manufacturing the sensor device according to claim 1, comprising:
   forming a through-hole in said at least one sealing member; and
   embedding a conductive material in said through-hole to form said conductive through-path.

6. The method according to claim 5, wherein said embedding includes:
   depositing said conductive material on a surface of said through-hole; and
   depositing said conductive material to allow said through-hole to be entirely filled therewith.

7. A sensor system comprising:
   the sensor device as defined by claim 1; and
   an integrated circuit for driving said sensor device.

8. The sensor system according to claim 7, wherein said integrated circuit and said sensor device are joined together to form a stacked body, wherein said sensor system further includes:
   a molded interconnect device substrate supporting said stacked body without interposing between said sensor device and said integrated circuit; and
   a mounting external electrode provided in said molded interconnect device substrate and electrically connected to at least either one of said sensor device and said integrated circuit through said molded interconnect device substrate.

9. The sensor system according to claim 7, which further includes:
   a molded interconnect device substrate interposed between said sensor device and said integrated circuit to support each of said sensor device and said integrated circuit in a stacked manner, and adapted to relay the electrical connection between said sensor device and said integrated circuit; and
   a mounting external electrode provided in said molded interconnect device substrate and electrically connected to at least either one of said sensor device and said integrated circuit through said molded interconnect device substrate.

10. The sensor system according to claim 9, wherein said mounting external electrode is a stepwise bent pin.

11. A method of manufacturing the sensor system according to claim 9, comprising forming a portion electrically connecting between said molded interconnect device substrate and either one of said sensor device and said integrated circuit, at normal temperature.

12. The sensor system according to claim 7, wherein said integrated circuit and said sensor device are joined together to form a stacked body, wherein said sensor system further includes a mounting external electrode provided in said stacked body.

13. The sensor system according to claim 12, wherein:
   said mounting external electrode is disposed on one surface of said integrated circuit on the opposite side of the other surface thereof facing to said sensor device; and
   said integrated circuit includes an integrated circuit board formed with a circuit for driving said sensor device, and a wiring pattern extending along a side surface of said integrated circuit board to electrically connect between said mounting external electrode and said sensor device.

14. The sensor system according to claim 12, wherein:
   said mounting external electrode is disposed on one surface of said sensor device on the opposite side of the other surface thereof facing to said integrated circuit; and
   said sensor device includes a second wiring pattern extending along respective side surfaces of said upper and lower sealing members to electrically connect between said mounting external electrode and said integrated circuit.

* * * * *

UNITED STATES PATENT AND TRADEMARK OFFICE
CERTIFICATE OF CORRECTION

PATENT NO. : 7,642,611 B2
APPLICATION NO. : 10/598847
DATED : January 5, 2010
INVENTOR(S) : Tsuji et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 276 days.

Signed and Sealed this

Twenty-first Day of December, 2010

David J. Kappos
*Director of the United States Patent and Trademark Office*